United States Patent [19]
Triebe et al.

[11] Patent Number: 5,889,456
[45] Date of Patent: Mar. 30, 1999

[54] NMR MEASURING DEVICE HAVING A COOLED PROBE HEAD

[75] Inventors: René Triebe, Zürich; Daniel Marek, Möriken, both of Switzerland

[73] Assignee: Spectrospin AG, Fällanden, Switzerland

[21] Appl. No.: 49,196

[22] Filed: Mar. 27, 1998

[30] Foreign Application Priority Data

May 16, 1997 [DE] Germany ......................... 197 20 677.8

[51] Int. Cl.$^6$ ...................................................... H01F 5/00
[52] U.S. Cl. .......................... 335/300; 324/318; 62/47.1; 505/892
[58] Field of Search ................... 62/47.1, 48.1, 62/48.4, 54, 45; 324/318, 319, 320, 321; 335/216, 296, 300, 299; 505/892, 900

[56] References Cited

U.S. PATENT DOCUMENTS

| | | | |
|---|---|---|---|
| 4,277,949 | 7/1981 | Longsworth | 62/54 |
| 4,279,127 | 7/1981 | Longsworth | 62/77 |
| 5,247,256 | 9/1993 | Marek . | |
| 5,508,613 | 4/1996 | Kotsubo et al. . | |

OTHER PUBLICATIONS

Patents abstracts of Japan P–1653 Dec. 3, 1993, vol.17/No.654 "Probe for Nuclear Magnetic Resonance Device" JP 5–215829 published Aug. 27, 1993.

*Primary Examiner*—Lincoln Donovan
*Attorney, Agent, or Firm*—Paul Vincent

[57] ABSTRACT

An NMR measuring device contains an NMR probe head (10a) having an NMR receiver coil (11), and the probe head can be supplied via a cryogenically insulated transfer conduit (9) with coolant from a cooling device (1a). The cooling device comprises a cryo-cooler (2) having a first cooling stage (4) with a first stage exchanger (12) and a second cooling stage (3) having a second stage exchanger (8). A pump (6) transports coolant in the cooling circuit. The NMR probe head (10a), in addition to the NMR receiver coils (11), has preamplifiers (21) for amplifying the received NMR signals and an additional cryogenically insulated transfer conduit (20) is inserted between the cooling device (1a) and the NMR probe head (10a) by means of which, the preamplifiers (21) and/or the components in contact with the preamplifiers (21) can be supplied with a flow of coolant at a higher temperature than that used for cooling the NMR receiver coils (11). Only the cryo-cooler (2) and, if appropriate, additional heat exchangers are required for cooling both coolant streams. In this fashion a substantial reduction in noise, including that of the amplifiers, is achieved using simple techniques and without great technical expense and difficulty.

13 Claims, 7 Drawing Sheets

PRIOR ART

Fig. 5

PRIOR ART

NMR MEASURING DEVICE HAVING A COOLED PROBE HEAD

This application claims Paris Convention Priority of German patent application number 197 20 677.8 filed May 16, 1997 the complete disclosure of which is hereby incorporated by reference.

BACKGROUND OF THE INVENTION

The invention concerns a measuring device for nuclear magnetic resonance (NMR) measurements having an NMR probe head containing one or more NMR receiver coils. The probe head can be supplied with coolant from a cooling device via a cryogenically insulated transfer conduit, wherein the cooling device comprises a cryo-cooler having a first cooling stage with a first stage exchanger and with a second cooling stage having a second stage exchanger, wherein a pump is provided for transporting the coolant, initially at room temperature, within a circuit through a first counter-flow exchanger, the first stage exchanger, a second counter-flow exchanger, the second stage exchanger and the transfer conduit into the NMR probe head for cooling the NMR receiver coil(s) and back again through the transfer conduit, the second counter-flow exchanger and the first counter-flow exchanger. NMR measuring device of this kind is known in the art from U.S. Pat. No. 5,508,613.

NMR spectroscopy is a measuring method with which the structure of chemical compounds can be precisely determined. This advantage has, however, a greater associated disadvantage: NMR spectroscopy is unfortunately also a relatively insensitive measurement method which, in general, only has rather small signal-to-noise-ratios (S/N-ratio). It is therefore necessary to entertain all possible steps which could lead to an increase in sensitivity.

This S/N-ratio can be substantially improved by optimizing the geometry, through careful choice of the materials and by using precisely tuned material compositions for the NMR receiver coil. However, it turns out that one has now reached the limits of this type of optimization process and further improvements can only be expected in small steps. For this reason, it has become necessary to investigate new methods for optimizing even if same are associated with substantial effort and expense. One such possibility is the cryogenic cooling of the receiver coil with its electrical resonant and tuning network. In an additional step, the preamplifier must also be cooled so that its noise remains small relative to the receiver coil.

The expression "receiver coil" is not meant to refer only to pure inductances but also to resonators comprising distributed inductance and/or capacitance to effect a system capable of resonance in the radio frequency region.

In most NMR measurements, the S/N-ratio of the NMR signal at the output of the receiver is primarily limited by the S/N ratio of the receiver coil. This S/N ratio depends on the size of the NMR signal received from a standard sample compared to the intrinsic noise of the coil. The size of the NMR signal depends on the geometry of the receiver coil and on how closely the coil surrounds the sample. These properties cannot be influenced by temperature. This is not the case, however, for the intrinsic noise of the coil which is produced by the high-frequency loss resistance $R_{HF}$ of the coil and depends on the size of its resistance $R_{HF}$ and on its temperature: more precisely, on the square root of the product $R_{HF} \cdot T$.

Cooling the receiver coil to below 30 K. reduces both its resistance $R_{HF}$ as well as its temperature T leading to a substantial reduction in the intrinsic noise and to a corresponding increase in the S/N ratio.

U.S. Pat. No. 5,508,613 discloses a conventional NMR measuring device having a cooled NMR receiver coil. An additional problem not solved by the conventional apparatus is, however, the intrinsic noise of the preamplifier which amplifies the NMR signals emanating from the NMR receiver coil and which normally operates at room temperature.

It is therefore the purpose of the present invention to present an NMR measuring device of the above mentioned kind with which a substantial reduction in noise, including that of the preamplifier, is effected in as simple a manner as possible and without substantial technical difficulty and expense.

SUMMARY OF THE INVENTION

This purpose is achieved in accordance with the invention in that, in the NMR probe head, in addition to the NMR receiver coil or coils, one or more preamplifiers for amplifying the NMR signals received by the NMR receiver coils are present and an additional cryogenically insulated transfer conduit is provided between the cooling device and the NMR probe head through which the preamplifier or preamplifiers and/or the components connected to the preamplifiers, e.g. radio-frequency (RF) switches, RF filters, mounting elements and the like, can be supplied with a flow of coolant which has a higher temperature than the coolant utilized for cooling the NMR receiver coil and only a cryo-cooler and, if appropriate, additional heat exchangers are provided for cooling both cooling streams.

The designation "cryo-cooler" refers to a device having a cooling surface for cooling objects and operated with cryogenic media, for example, a Gifford-McMahon cooler, a pulse tube cooler or a Joule-Thomson-cooling apparatus.

A cooling of the preamplifier to minimize noise should not take place substantially below 80 K., since the electronic components produced using silicon technology would not function properly. Luckily, the preamplifier noise is sufficiently small even at this somewhat increased temperature that it no longer dominates the noise of the receiver coil. An embodiment of the measuring device in accordance with the invention is therefore advantageous with which the first coolant stream has a temperature below 20 K., preferentially about 15 K., directly after exciting the NMR receiver coil and the second coolant stream has a temperature of around 80 K., preferentially approximately 77 K. directly after exciting the preamplifier. The NMR receiver coils can thereby, in principle, also be cooled to lower temperatures. This would, however, require substantial expense and difficulty, in particular with regard to the cryo-cooler, and would no longer be justifiable compared to the improvement thereby achieved.

In an additional embodiment of the measuring device in accordance with the invention, two separate cooling circuits are provided for cooling the NMR receiver coil and for cooling the preamplifier and/or the components connected therewith respectively. This embodiment has the advantage that no cooled valves are required.

An improvement in this embodiment provides that, in addition to the first stage exchanger, an additional stage exchanger is connected to the first cooling stage of the cryo-cooler, wherein the first stage exchanger is utilized for cooling the coolant flow in the cooling circuit of the NMR receiver coil and the additional stage exchanger is utilized in the cooling circuit of the preamplifier configuration of an additional stage exchanger on the first cooling stage leads to a compact arrangement.

In an improvement of this embodiment, an additional counter-flow exchanger is introduced into the cooling circuit of the preamplifier between the pump and the additional stage exchanger as well as the additional transfer conduit to increase the thermal efficiency. Separation of the two temperature regions of approximately 300 K. and approximately 80 K. is thereby achieved without significant thermal losses.

An improvement is advantageous with which at least one valve at approximately room temperature is provided in each cooling circuit for controlling the mass flow of the coolant. The room temperature valve serves for fine adjustment of the coolant flow and thereby the temperature distribution in both cooling circuits.

An embodiment of the measuring device in accordance with the invention is particularly preferred with which only one single cooling circuit is provided having two flow components for cooling the NMR receiver coil and for cooling the preamplifier and/or the components connected therewith, respectively. In contrast to the above described embodiment having two separate cooling circuits a smaller amount of cryogenic components are thereby necessary, since at least one counter-flow exchanger, serving as cooling buffer for the second cooling circuit, can be eliminated.

In an advantageous improvement of this embodiment, a cooled valve is provided for controlling the mass flow of the coolant flowing to the preamplifiers. In this manner, the two flow components of the coolant circuit can be fine-tuned and, in particular, the temperature of the preamplifiers can be precisely adjusted to secure proper performance, since they only operate reliably and in a noise-optimized fashion down to a temperature of approximately 80 K.

In a particularly preferred improvement, in addition to the first stage exchanger, an additional stage exchanger is connected to the first cooling stage of the cryo-cooler, wherein the additional stage exchanger is utilized for cooling the preamplifier and/or the components connected thereto and, if appropriate, a flow component of coolant flowing directly to the first stage exchanger and the first stage exchanger is utilized for cooling the coolant flowing to the NMR receiver coils. The additional stage exchanger effects an initial precooling of the coolant. The coolant warmed in the preamplifiers is then once more introduced to the first stage of the cryo-cooler and cooled-down with the first stage exchanger to improve the cooling efficiency of the second counter-flow exchanger and thereby reduce the load on the second cooling stage of the cryo-cooler.

In an alternative improvement of the above described embodiment, a flow component of the coolant flowing back from the NMR receiver coil via the second counter-flow exchanger is branched-off for cooling the preamplifier and/ or the components connected thereto and, subsequently, fed back through the additional transfer conduit and the first counter-flow exchanger to the pump. In this fashion, in contrast to the other described embodiments of the measuring device in accordance with the invention, the lowest NMR receiver coil temperatures can be achieved, since this embodiment has the largest cooling efficiency.

Alternatively thereto, the entire coolant flow from the NMR receiver coils can be guided via the second counter-flow exchanger to cool the preamplifier and/or the components connected thereto and subsequently passed through the additional transfer conduit and the first counter-flow exchanger to the pump. This solution is the simplest technically and the most compact and nevertheless has high efficiency. A cooled valve is not required in this case.

In an additional embodiment of the measuring device in accordance with the invention, a heater is provided in spatial proximity to the preamplifier with which a direct temperature control of the preamplifier can be easily effected.

An embodiment is also advantageous with which the first transfer conduit and the second transfer conduit share a common cryogenic insulation. The spatial proximity of the two transfer conduits and the common cryogenic insulation facilitate a particularly compact configuration and possible heat losses at the transfer conduits are reduced.

Further advantages of the invention can be derived from the description and the drawing. The above mentioned features and those to be further described below can be utilized in accordance with the invention individually or collectively in arbitrary combination. The embodiments shown and described are not to be considered exhaustive enumeration, rather have exemplary character only for illustrating the invention.

The invention is represented in the drawing and will be described more closely with reference to an embodiment.

DESCRIPTION OF THE PREFERRED EMBODIMENT

An additional cooled mass having a temperature between 300 K. and the temperature of the receiver coil can advantageously be utilized as a support for a receiver coil mounting. It is then no longer necessary to support components at room temperature and one achieves a substantial reduction in the heat input via the receiver coil mounting. In consequence thereof, more solid mountings and leads can be utilized without excessive heat input. The cooled mass can be cooled e.g. with the assistance of the first stage of a two-stage cryo-cooler.

Cooling a receiver coil to a region below 30 K. is not easy, since the coil cannot be effectively thermally insulated. The coil must closely surround the sample for sensitivity reasons. The sample, however, is at room temperature. The coil is therefore strongly irradiated with heat from the sample and from its room temperature surroundings and the resulting heat flow must be taken-up by the cooling device.

One can use liquid helium to cool the receiver coil and the preamplifier. This is, however, rather expensive, since, in consequence of the large heat flow from the sample and its surroundings, large quantities of extremely expensive helium must be used. It is more advantageous to utilize an active cryo-cooler. Although it would be most effective to dispose this cryo-cooler as close to the NMR probe head as possible this is, however, hard to do for reasons of lack of space and would, in addition, be difficult for mechanical reasons, since mechanical vibrations from the cryo-cooler can be easily transferred to the receiver coil. It is therefore advantageous to avoid direct coupling of the cooling power to the object being cooled by first transferring same to a helium gas flow which serves as the carrier and transport means for the cooling power. The transfer of the cooling power from the cryo-cooler to the helium gas can be effected by means of staged heat exchangers and the additional transfer from the heat exchanger to the object to be cooled can be effected via transfer conduits having internal high vacuum insulation.

The available commercial and standard cryo-coolers have a common problem. The cooling power which is available at temperatures about 10 K. is at most approximately 6 Watt. Higher cooling powers (e.g. 10 W and more) are, in principal, possible, however, are associated with costs which are so high that they are no longer commercially interesting for NMR applications. It is therefore essential that the cooling device be highly optimized so that the limited cooling power is coupled to the greatest extent possible to the location of the object being cooled. The configuration of such cooling devices requires a high degree of know-how and is the object of the present invention.

In order for the cooling power to be transferred, it is necessary for the helium gas to be circulated with the assistance of a pump. The simplest solution would be to operate this pump at the desired low temperature. This would, however, mean that moving mechanical parts would have to work reliably at the lowest of temperatures and for a long period of time which is extremely difficult. In addition, maintenance of such a pump would be associated with a high degree of difficulty and expense. A pump of this type also produces heat and thereby additionally loads the cooling efficiency.

It is therefore more advantageous to operate the pump at room temperature. This means, however, that the helium gas which leaves the object to be cooled, which is still very cold, must initially be warmed up before it can once more be introduced to the pump. During this warming process, a large amount of cooling power would be extracted from the helium gas which would normally be lost if special steps were not taken. Instead of depositing this cooling power unused in some kind of medium, same is utilized in a directed fashion to cool the warmer helium gas inside the cooling device. In particular, the cold helium gas which must be returned from the cooling device to the pump can be first used to pre-cool the warm gas flowing from the pump into the cooling device. In the ideal case, the helium gas entering into and exiting from the pump have the same temperature. The transfer of cooling power is effected via so-called counter-flow heat exchangers.

Normally, two types of heat exchangers are utilized in cooling devices,: the stage exchanger with one single gas conduit and the counter-flow exchanger having two gas conduits.

The stage exchanger requires direct thermal connection to a cold source (e.g. one of the cold stages of the cryo-cooler) and cools down the gas leaving the heat exchanger to the temperature of the cold source. The efficiency of this heat exchanger is largest when the outflowing gas has precisely the temperature of the cold source. This ideal efficiency is also actually achieved in practice!

The counter-flow exchanger is somewhat more critical and usually has an efficiency loss. It produces heat exchange between two oppositely flowing gas streams having differing temperatures and achieves same through a close thermal connection between the two gas conduits. The maximum transferable cooling power is given by the temperature difference between the warmer ($T=T_{warm}$) and the colder ($T=T_{cold}$) end of the heat exchanger. The efficiency of the counter-flow exchanger depends on how much of the maximum transferable cooling power is actually transferred from the cold gas to the warm gas. It is largest when the temperature difference $\Delta T$ between the two gas flows measured at each end of the heating exchanger is zero. In the event that a finite value of $\Delta T$ occurs, this value, in comparison to the temperature difference ($T_{warm}-T_{cold}$) across the heat exchanger, is a measure of the inefficiency of the heat exchanger and can be summarized by the inefficiency factor $k_{ineff}$:

$$k_{ineff}=\Delta T/(T_{warm}-T_{cold})$$

In practice, an inefficiency factor of 5% can be achieved with good design and a reasonable amount of effort. For the standard counter-flow exchanger shown in FIG. 4, $\Delta T=13$ K. and $(T_{warm}-T_{cold})=260$ K. The inefficiency factor is therefore 5%.

Figure 4:
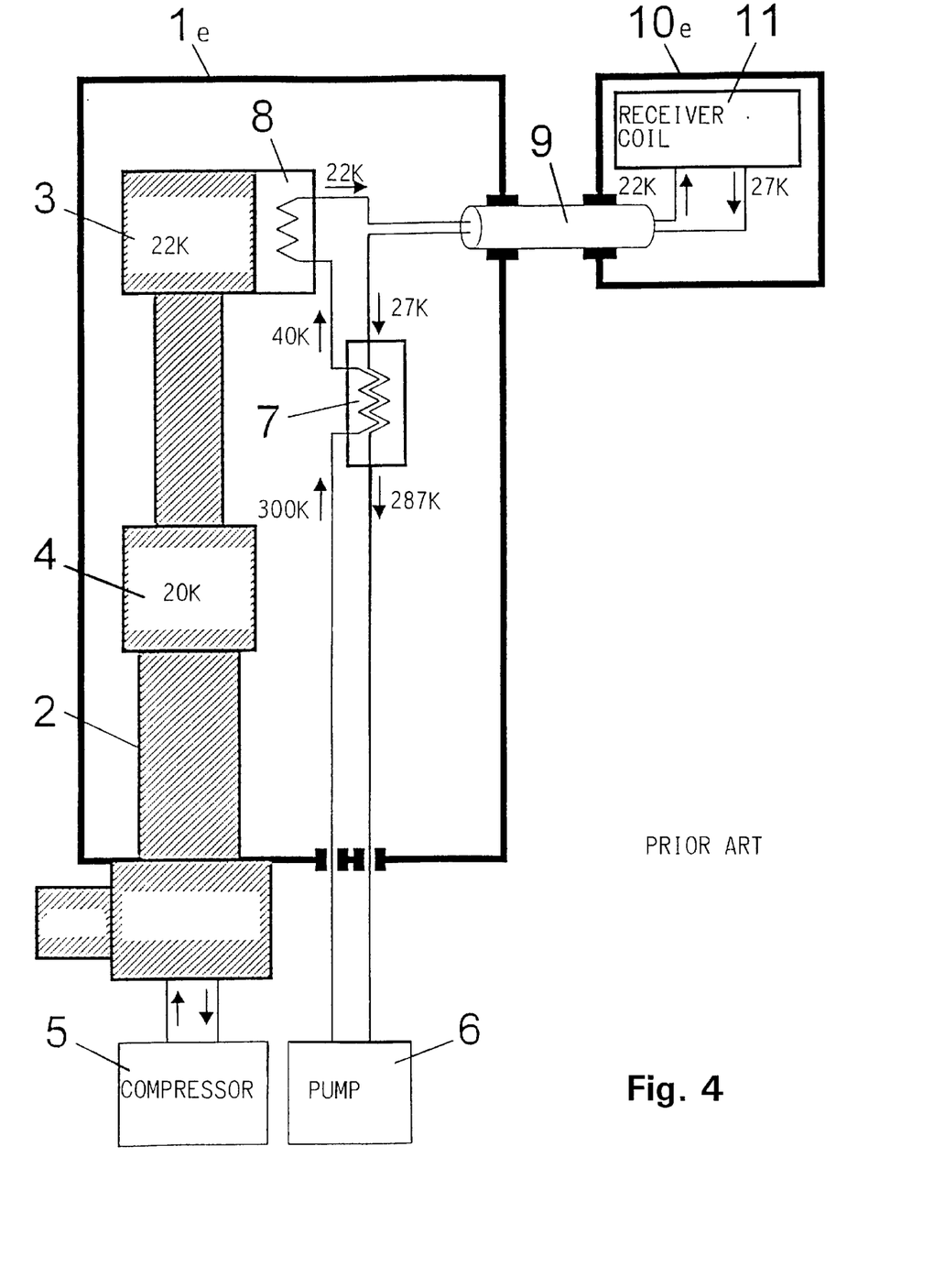
FIG. 4 shows a simple NMR measuring device of prior art having cooled receiver coils.

Due to this inefficiency, some amount of cooling power is lost and must always be extracted from the cooling stage connected to the cold end of the counter-flow exchanger. In the case of FIG. 4 this is the second stage of the cryo-cooler.

Counter-flow exchangers are utilized when the temperature of a cold gas must be increased while losing as small an amount of gas cooling energy (physically defined by the enthalpy) as possible. The counter-flow exchanger solves this problem by transferring the cooling energy contained in the colder gas stream to the warmer gas. In the conventional counter-flow exchanger of FIG. 4, the cold gas stream is warmed from 27 K. to 287 K. while the warm gas stream is cooled from 300 K. to 40 K. Due to the inefficiency of the heat exchanger, there is a difference of 13 K. between the two gas streams which is lost without being used and which loads the second stage.

Differing factors must be taken into account in order to keep the heat loss of a cooling device as low as possible;

1. All returning colder gas streams must be utilized to pre-cool the inflowing warmer gas streams. In this manner, the temperature of the helium gas flowing back into the pump can be nearly the same as that of the gas which flows from the pump into the cooling device.

2. The stage exchanger should have the ideal efficiency of 100% so that the entire cooling power of the cryo-cooler can be transferred to the helium gas.

3. The counter-flow exchanger should have as small an inefficiency factor as possible in order to prevent unnecessary loading of the cooling stage of the cryo-cooler.

4. The number of components within the cooling device should be minimized, since these components cause cooling losses.

5. The mass flow of the helium gas must be carefully optimized.

6. The transfer conduits with which the cold helium gas is transported to the object to be cooled should have as low a heat loss as possible.

In order to compare differing cooling devices with each other one must make several assumptions which should be applied to all cooling devices:

1. The mass flow of the helium gas to the sensitive coil is assumed to be 55 standard liters/min. This value leads to a transport power of the helium gas of 1 Watt/K.
2. A commercially available two-stage cryo-cooler is assumed and the characteristic curves of both of its cooling stages are relatively accurately approximated by simple equations. These equations are:

first stage: $T_1(P_1)=20$ K.$+P_1 \cdot 0.5$ K./Watt second stage: $T_2(P_2)=4$ K.$+P_2 \cdot 1.0$ K./Watt $T_1$ and $T_2$ are the temperatures which establish themselves on the two cooling stages when the cooling powers given off are $P_1$ and $P_2$ respectively.

3. All stage exchangers have an ideal efficiency.
4. All counter-flow exchangers have an inefficiency factor of 5%. This leads to a temperature difference $\Delta T$ between the two ends of the exchanger of $\Delta T=0.05 \cdot (T_{warm}-T_{cold})$ and, when one assumes the standard flow of 55 standard liters/min (=1 Watt/K. transport power), to a load $\Delta Pt$ of the cold stage at the colder side of the exchanger of $$\Delta Pt=(T_{warm}-T_{cold}) \cdot 0.05 \text{ Watt/K.}$$

5. A heat irradiation of 5 Watts is present in the vicinity of the receiver coil.
6. The preamplifier works at a temperature of 77 K.
7. The preamplifier produces 20 Watts of heat with its electronics. The desired temperature of 77 K. can be maintained using an additional heater on the preamplifier housing or with a by-pass valve which reduces the mass flow of the helium gas to the preamplifier.

The above mentioned measures are assumed below. The given temperature and mass flow values are therefore exemplary only and result from these assumptions: other temperatures and mass flows are also possible.

Figure 5:
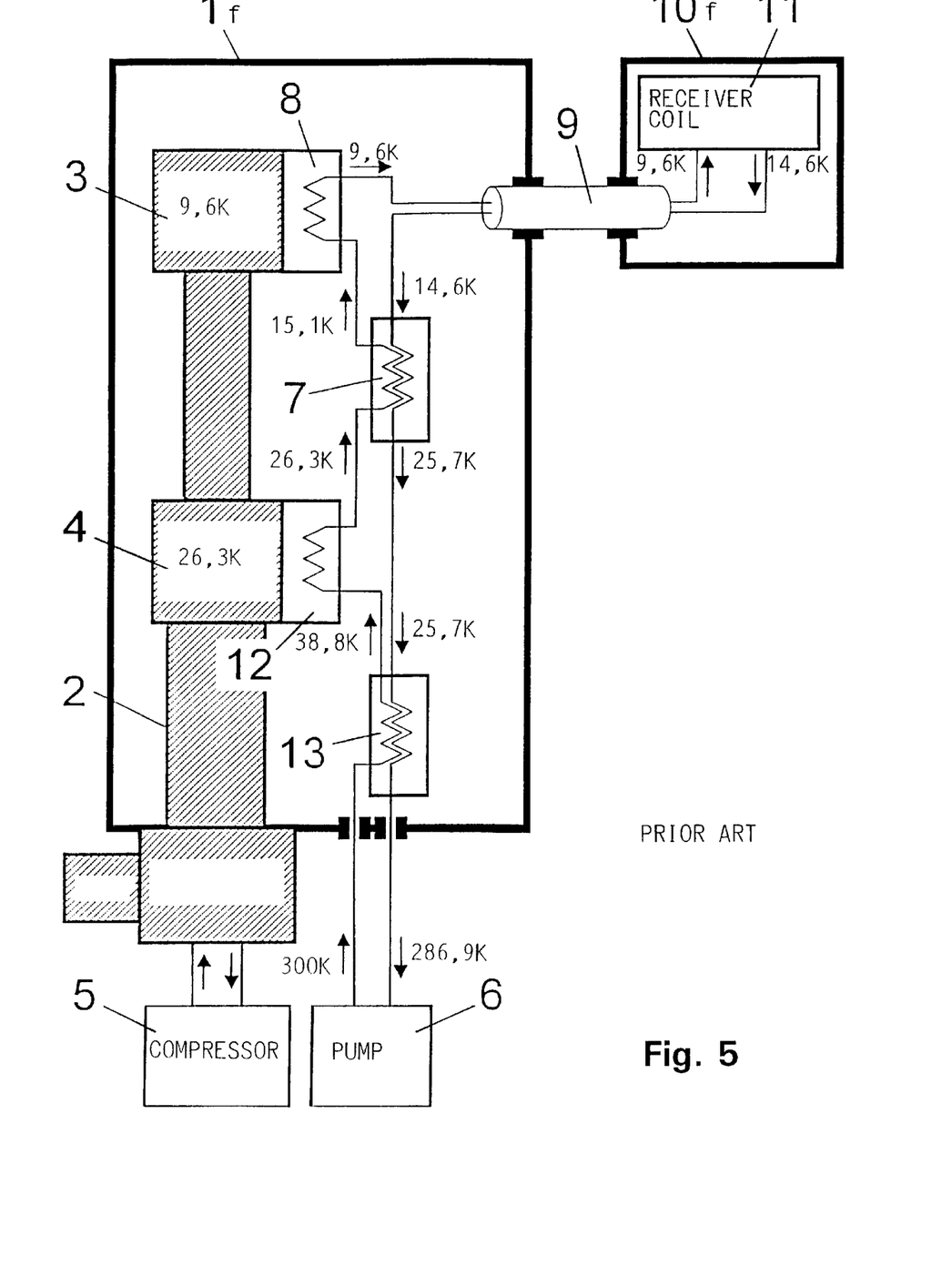
FIG. 5 shows an NMR measuring device of prior art in accordance with U.S. Pat. No. 5,508,613 having improved efficiency compared to the conventional device shown in FIG. 4.
Figure 6:
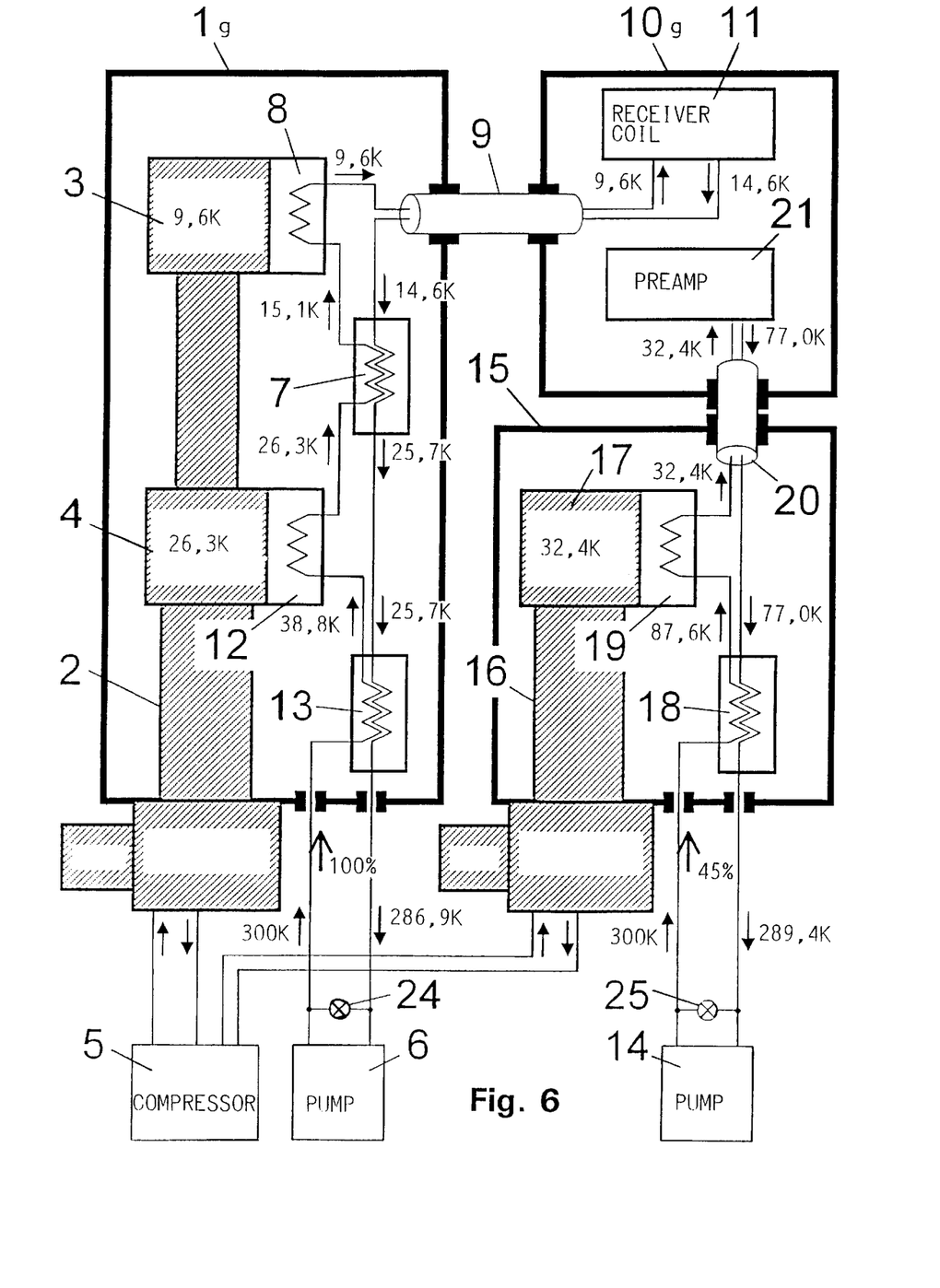
FIG. 6 shows an NMR measuring device capable of cooling the NMR receiver coil and with a special cooling device for cooling the preamplifier.

Current conventional cryo-devices for cooling NMR receiver coils are shown in FIGS. 4 and 5. Both cooling devices effect cooling of the receiver coil to a temperature below 30 K. An improved configuration with respect thereto with which both the receiver coil as well as the preamplifier are each cooled down to a different temperature is shown in FIG. 6.

The simplest version is shown in FIG. 4. It consists essentially of a cooling device 1e, whose inner portion is evacuated to prevent thermal losses from heat conduction in the air. The cooling is effected by means of a cryo-cooler 2 which is connected via a gas conduit to a compressor 5 and comprises a first cooling stage 4 at 20 K. and a second cooling stage 3 at 22 K. Both stages are cold sources and have thermal contact surfaces to which individual components can be connected and cooled. Such an individual component is a stage exchanger 8 which is connected to the second cooling stage 3 of the cryo-cooler 2.

The pump 6 is a circulating pump which circulates the helium gas in a closed circuit. The room temperature (300 K.) helium gas from the pump enters into the cooling device where it is pre-cooled by a counter-flow exchanger 7 to 40 K. The helium gas is then cooled in stage exchanger 8, connected to the second stage 3 of the cryo-cooler, to 22 K. This helium gas is introduced via a transfer conduit 9 of receiver coil 11 into an NMR probe head 10e to thereby cool the receiver coil 11 to 27 K. The helium gas is thereby warmed to 27 K. and passes through the transfer conduit 9 back into the cooling device 1e, where it once more enters into the counter-flow exchanger 7, is warmed up to 287 K. therein, and passes on to the pump at nearly room temperature.

FIG. 5 also shows a conventional configuration (corresponding approximately to U.S. Pat. No. 5,508,613) which has a better efficiency. In addition to the second cooling stage 3, the cryo-cooler 2 of the cooling device 1f also has a first stage 4 for cooling the helium gas and requires two counter-flow exchangers 13 and 7 therefor. Since the entire temperature region is distributed on two counter-flow exchangers, the critical second stage 3 only has to carry the load $\Delta T=0.5$ K. of counter-flow exchanger 7 with the much larger load $\Delta T=13.1$ K. of counter-flow exchanger 13 being taken over by the first stage. In this manner, the second stage 3 can deliver colder gas, i.e. more cooling power, to the receiver coil 11 in the NMR probe head 10f.

The entering room temperature helium gas is first pre-cooled with the assistance of the first counter-flow exchanger 13 to 38.8 K. and then, in a stage exchanger 12 of the first stage 4 of the cryo-cooler 2, to 26.3 K. before entering into the second counter-flow exchanger 7 where it is cooled to 15.1 K. and, subsequent thereto, in stage exchanger 8 of the second stage 3, to a final temperature of 9.6 K. This cold gas is guided via transfer conduit 9 to the receiver coil 11 to cool same to 14.6 K. The gas warmed to 14.6 K. then once more enters into the cooling device if via the transfer conduit 9 and flows back to pump 6 via the counter-flow exchangers 7 and 13. The incoming and outgoing helium gas at the pump 6 have approximately the same temperature leading to good utilization of the cold power of the gas.

FIG. 6 shows a cooling device for cooling both the receiver coil 11 as well as the preamplifier 21 in an NMR probe head 10g to two different temperature regions: below 20 K. and approximately 77 K. Towards this end, two cryo-coolers 2 and 16 and two separated cooling circuits are used, a first one for the receiver coil driven by pump 6 and a second for the preamplifier driven by a pump 14. The first cooling circuit is cooled by the conventional cooling device of FIG. 5 and has a standard flow of 55 standard liters/min which is adjusted with a valve 24 and is designated in FIG. 6 as 100%. The second cooling circuit is then cooled only by a one-stage cryo-cooler 16 and its mass flow is adjusted with a valve 25 in such a fashion that the preamplifier 21 has the desired temperature of 77 K. The amount of mass flow necessary therefor is 45% of the standard flow and is likewise indicated in FIG. 6.

The cooling device 1g is identical with the conventional device described in FIG. 5 and does not need further explanation. With the additional cooling device 15 of FIG. 6, the helium gas which leaves the pump 14 at room temperature is pre-cooled in a counter-flow exchanger 18 to 87.6 K. and subsequently cooled to 32.4 K. in a stage exchanger 19 which is connected to the first and only cooling stage 17 of cryo-cooler 16. The helium gas cooled in this fashion gains entrance via transfer conduit 20 into the NMR probe head log and to preamplifier 21 which is cooled to 77 K. In this fashion, the gas is warmed from 32.4 K. to 77 K. and travels back into the cooling device 15 where it gives up its remaining cooling energy via the counter-flow exchanger 18 to the inflowing warm helium gas from the pump 14 and, subsequently, with nearly room temperature i.e. with 289.4 K., flows back into the pump 14.

In NMR, two mutually orthogonal coil systems or resonators are normally disposed near the sample and can be used for both excitation of the spin system as well as for reception of the NMR signal. Both coil systems or resonators are normally tuned to differing nuclear species, e.g. one coil system to protons $^1$H and the other to phosphorous $^{31}$P. In addition, each of the two coil systems or resonators can, at the same time, be tuned to two or more nuclear species to facilitate a plurality of measurement possibilities. Subsequent reference to a receiver coil 11 designates such coil or resonator systems.

In correspondence with the above description, NMR signals can be received simultaneously from a plurality of nuclear species. These NMR signals are normally present in different frequency regions and therefore require different preamplifiers. Subsequent reference to a preamplifier 21 also designates a plurality of such preamplifiers.

Figure 1:
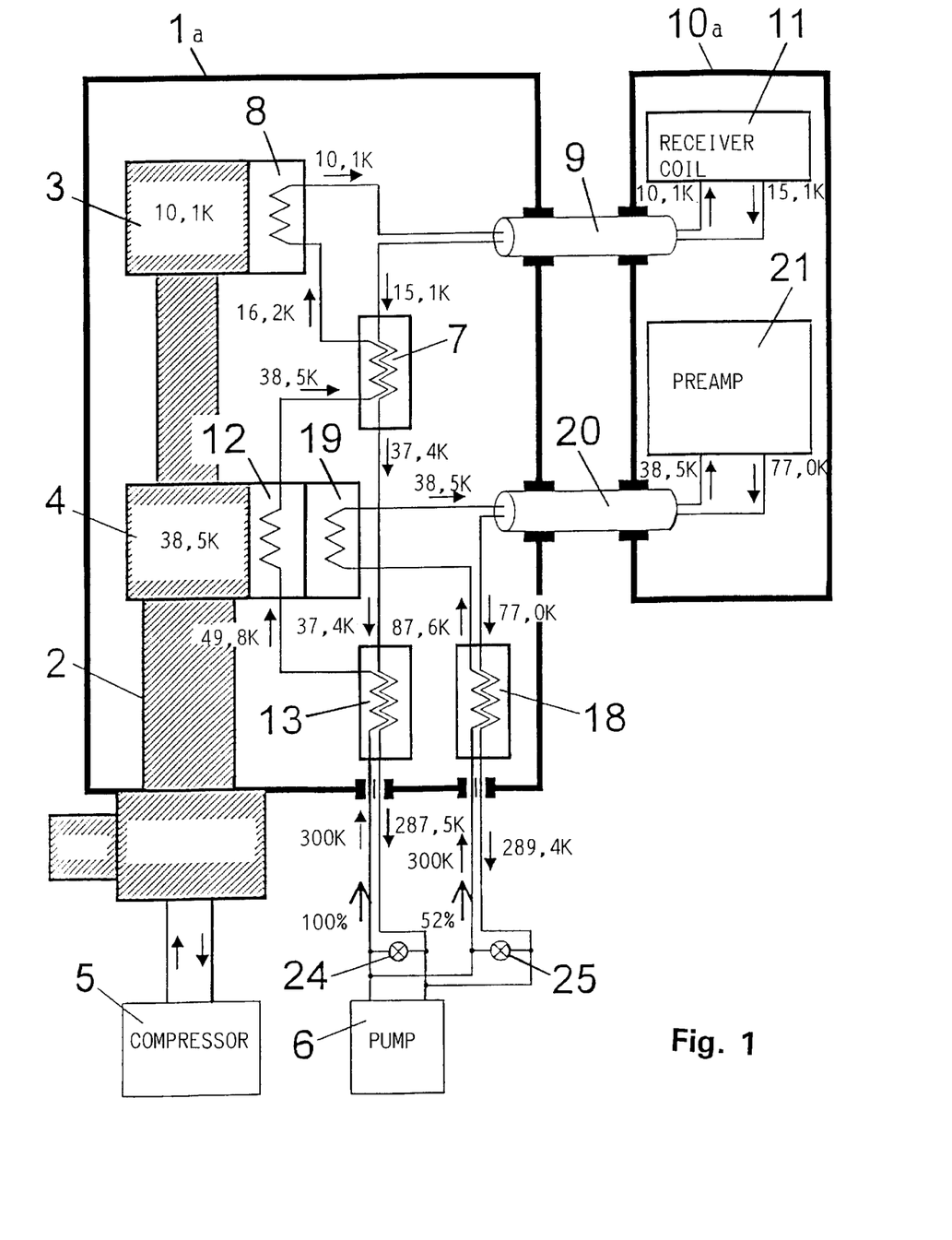
FIG. 1 shows a first embodiment of the measuring device in accordance with the invention having two separate cooling circuits.
Figure 2:
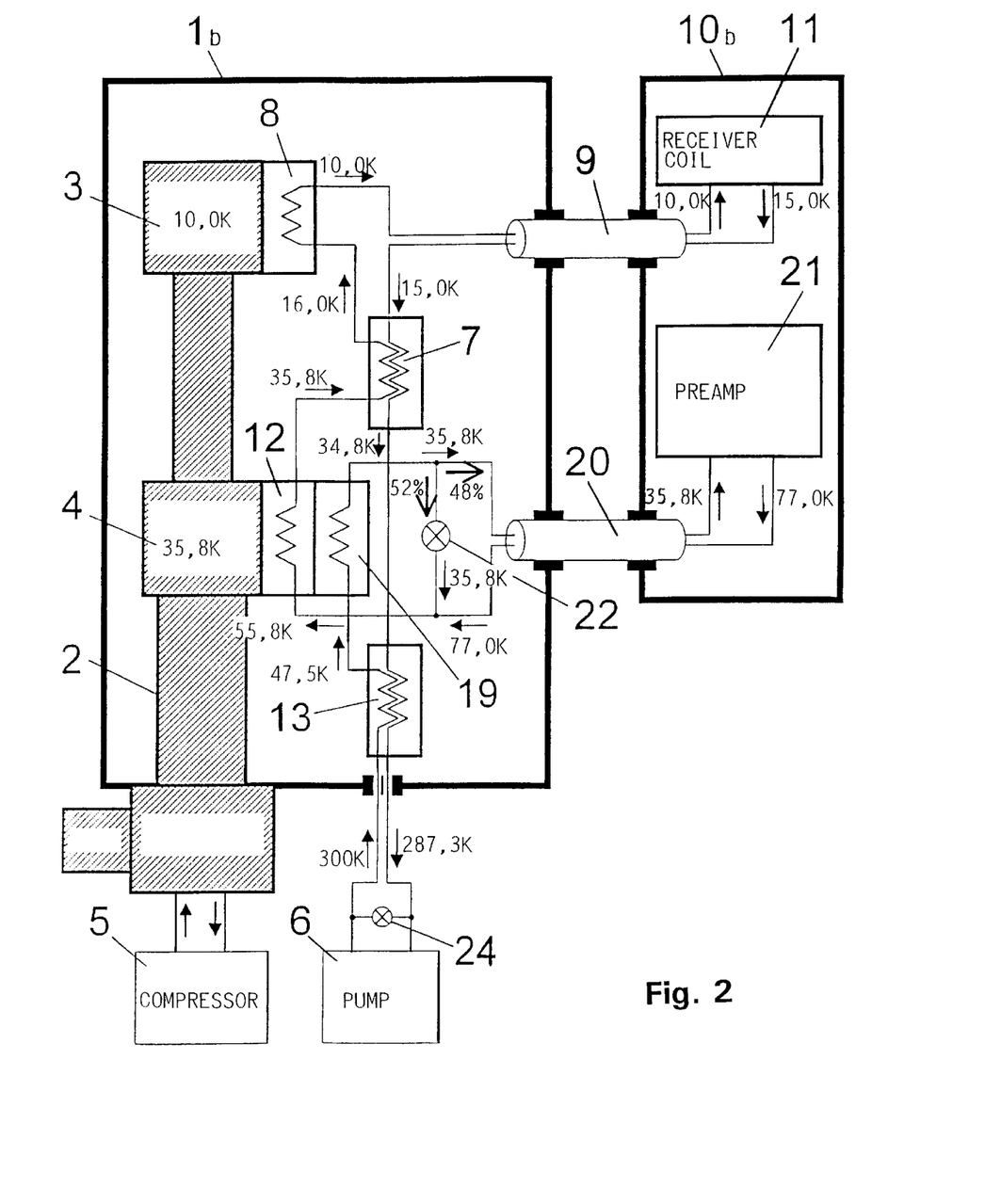
FIG. 2 shows an embodiment of the invention having one single cooling circuit.
Figure 3A:
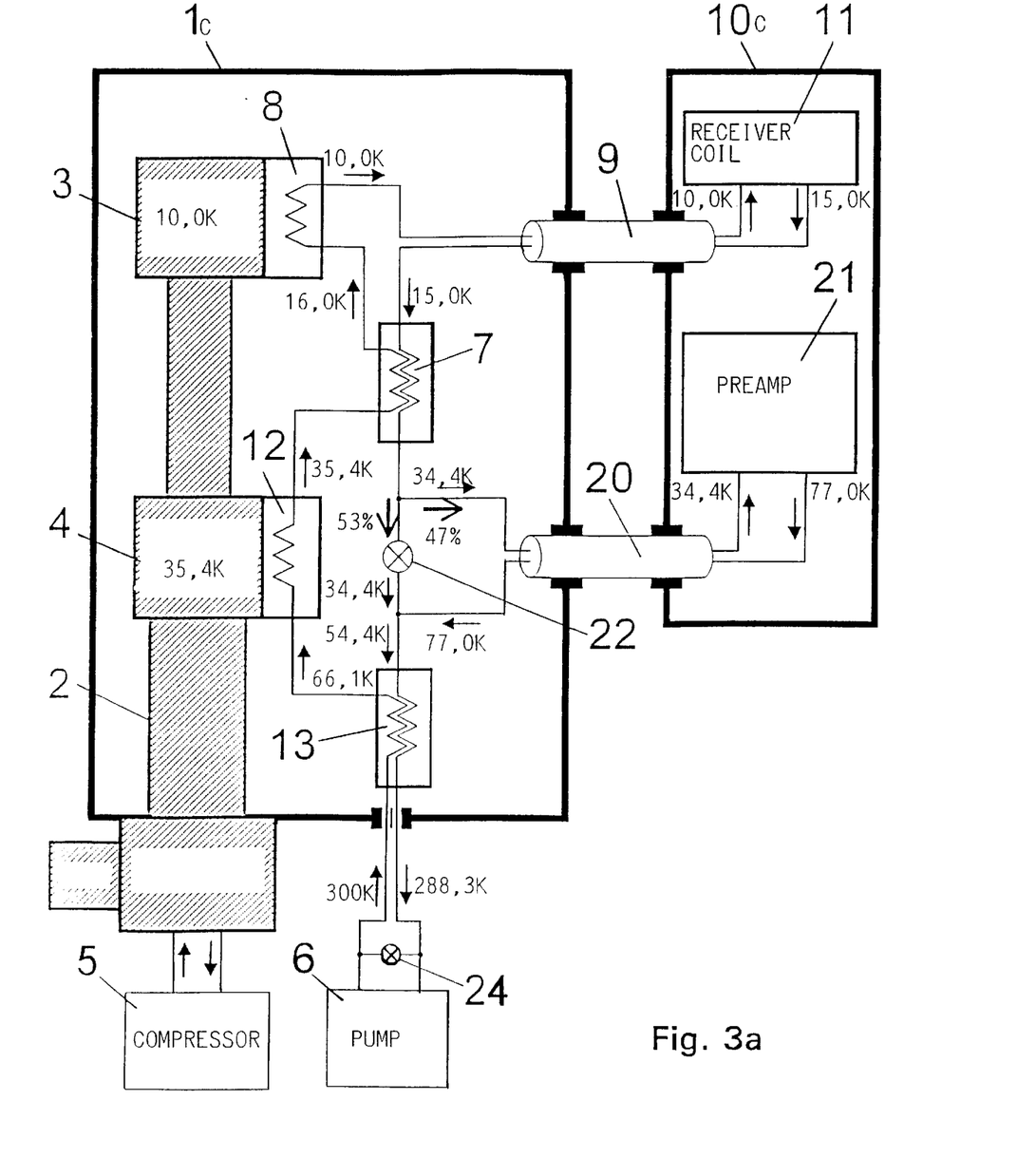
FIG. 3a shows an additional embodiment with one single cooling circuit, however, without an additional stage exchanger.

The cooling devices in accordance with the invention are shown in FIGS. 1, 2 and 3a/3b. All three devices have a plurality of common features:

1. They use only one two-stage cryo-cooler to satisfy all cooling requirements.
2. They are constructed in such a fashion that they can simultaneously cool two objects, namely the NMR receiver coil and the associated preamplifier, each to a different temperature.
3. They have practically identical construction to connect the receiver coil with the second stage of the cryo-cooler and to transfer the remaining cooling power of the return-flowing gas in a counter-flow exchanger to the incoming gas.

The three devices differ essentially from one another in the manner in which the preamplifier is cooled to a temperature of 77 K.

The first device is shown in FIG. 1. It uses a second separate helium gas circuit to cool the preamplifier 21. The first circuit cools the receiver coil 11 and is driven by the pump 6. The second circuit cools the preamplifier 21. In contrast to the cooling device of FIG. 6, the first cooling stage 4 of the cryo-cooler 2 cools both the first as well as the second circuit. In contrast to FIG. 6, only one cryo-cooler 2 is thereby required with substantially less difficulty and expense. The description of the first circuit can be extracted from the description of FIG. 5 and that of the second from FIG. 6.

Individual adjustment of the gas flow in the two circuits is essential for efficient cooling operation. This is effected with the assistance of the two valves 24 and 25 which are located outside of the cooling device la in the vicinity of the pump 6. The standard flow is adjusted with the first valve 24 (indicated in FIG. 1 with 100% so that the earlier mentioned comparative assumptions are fulfilled). The second valve 25 is much more important and adjusts the mass flow of the second circuit in such a fashion that the preamplifier has the desired temperature of 77 K. Towards this end, 52% of the standard flow is required as indicated in FIG. 1.

In the second device shown in FIG. 2, only one single helium gas circuit is required and is driven by the pump 6 to cool both the receiver coil 11 as well as the preamplifier 21. This is achieved in that cooling of the preamplifier 21 is switched-in between the counter-flow exchanger 13 and the stage exchanger 12. The helium gas exiting the counter-flow exchanger 13 first gains entrance to the stage exchanger 19 where it is cooled from 47.5 K. to 35.8 K. The valve 22 is adjusted in such a fashion that exactly that quantity of gas gains entrance to the preamplifier 21 which is required for cooling the preamplifier 21 to the desired temperature of 77 K. This amount of gas is 48% of the entire flow. The remaining 52% gains access directly via valve 22 to the second stage exchanger 12. The gas fraction of 48% gains access via the transfer conduit 20 into the NMR probe head 10b to cool the preamplifier 21 to precisely 77 K. and thereby warm up to 77 K. before it once more gains entrance via the transfer conduit 20 to the cooling device 1b to mix with the gas from the valve 22 and assume a temperature of 55.8 K. This gas then enters second stage exchanger 12, is cooled at that location to 35.8 K. and subsequently guided into the counter-flow exchanger 7. From this location all processes proceed as in FIG. 1. The valve 24 thereby adjusts the gas flow in the cooling device 1b to the assumed standard flow.

The third cooling device shown in FIG. 3a gives the best results. In this device, the gas return connection from the counter-flow exchanger 7 to the counter-flow exchanger 13 is interrupted and a cooling connection established via the transfer conduit 20 to the preamplifier 21. The stage exchanger 19 of FIG. 2 is therefore no longer required. This cooling device has the smallest number of components and provides results better than those of the two other devices leading, in addition, to a reduction in over-all cost.

Similar to the device of FIG. 2, the gas flow to the preamplifier 21 can be adjusted with valve 22 to cool the preamplifier 21 to 77 K. The amount of gas necessary therefor is 47% of the over-all flow and has a temperature of 34.4 K. This gas is warmed during this cooling process from 34.4 K. to 77 K., flows via the transfer conduit 20 back into the cooling device 1c and mixes with the gas from the valve 22 to assume a temperature of 54.4 K. and subsequently gain entrance to the counter-flow exchanger 13 and then back to the pump 6.

In principle, the valve 22 adjusts the cooling power guided via the helium gas to the preamplifier 21 in such a fashion that the 20 W produced by the preamplifier 21 are removed and the desired temperature of 77 K. achieved. One could also do without the valve and guide the full cooling power of the gas to the preamplifier 21. Without any counteracting measures, the preamplifier 21 would then cool down strongly to temperatures below 77 K. One could, however, prevent this from occurring by introducing a heater 23 onto the housing of the preamplifier 21 to heat-up the preamplifier to the desired temperature of 77 K. The cooling device shown in FIG. 3b uses such a heater 23. The heater has, however, the disadvantage that the first stage 4 of the cryo-cooler 2 is more strongly loaded which also somewhat affects the second stage 3. The temperature on the output of the stage exchanger 8 therefore increases from 10.0 K. (see FIG. 3a) to 10.3 K. (see FIG. 3b).

Figure 3B:
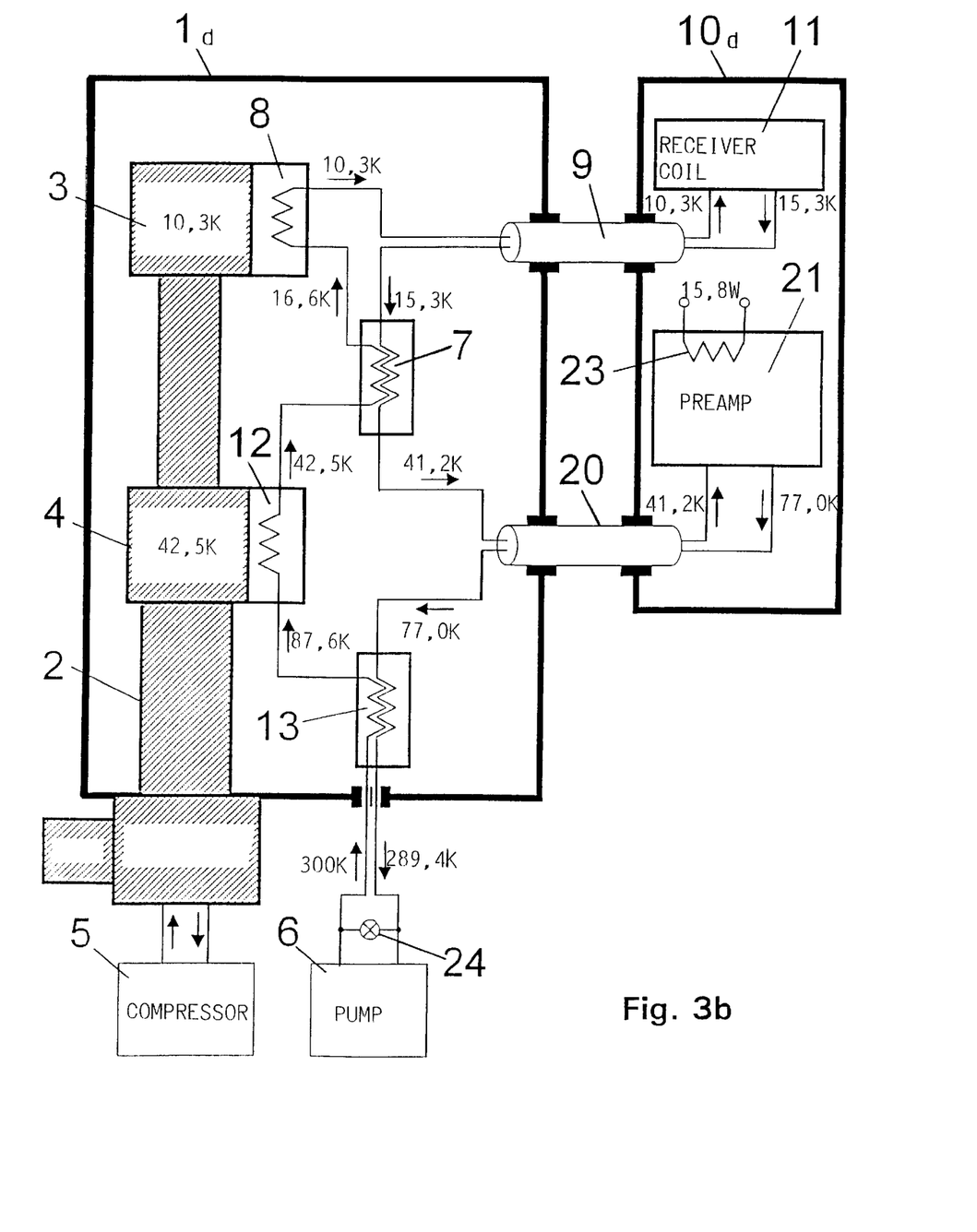
FIG. 3b shows an embodiment such as FIG. 3a, however, without a cooled valve.

The utilization of a heater 23 is not only limited to the configuration in accordance with the invention of FIG. 3b. It could also be used in the two other configurations in accordance with the invention of FIGS. 1 and 2.

A certain amount of reserve cooling power for the preamplifier 21 is naturally advantageous. One can quantify the size of this reserve with a number by determining the maximum electrical power loss which the preamplifier can produce so that a cooling of 77 K. is precisely possible. This maximum power loss is shown in the table for both the configuration of FIG. 6 as well as for the three configurations in accordance with the invention of FIG. 1, FIG. 2 and FIG. 3a/3b.

The cooling device in accordance with FIG. 6 gives the best numbers of namely 42.5 W for the maximum power loss of the preamplifier and 14.6 K. for the associated temperature of the receiver coil. This configuration requires, however, enormous effort with regard to components; two cryo-coolers, three stage exchangers, and three counter-flow exchangers. For this reason, this configuration is very expensive and not attractive for commercial applications.

The cooling device of FIG. 3a behaves differently and has somewhat worse values of 35.8 W for the preamplifier and 15.3 K. for the receiver coil but achieves these with substantially less components. Only one cryo-cooler, two stage exchangers and two counter-flow exchangers are required. The over-all cost effectiveness is therefore excellent in this case and it is extremely attractive for commercial applications.

The cooling device in accordance with the invention of FIG. 1, FIG. 2 and FIG. 3a/3b can also function with reversed gas flow direction. The efficiency of the cooling could, however, thereby be somewhat worse.

| cooling device | maximum allowed power loss $P_{max}$ of the preamplifier | temperature of the preamplifier (constant) | temperature of the receiver coil at $P_{max}$ of the preamplifier |
|---|---|---|---|
| FIG. 6 | 42.5 W | 77K | 14.6K |
| FIG. 1 | 30.9 W | 77K | 15.5K |
| FIG. 2 | 34.3 W | 77K | 15.3K |
| FIG. 3a/3b | 35.8 W | 77K | 15.3K |

We claim:

1. An NMR measuring device comprising:

an NMR probe head having a receiver coil and a receiver coil preamplifier;

one single cryo-cooler having a first cooling stage and a second cooling stage, said first cooling stage having a first stage temperature which is higher than a second stage temperature of said second cooling stage;

a first cooling circuit having a first coolant flow communicating with said preamplifier to cool said preamplifier to a preamplifier temperature and having a first cryogenically insulated transfer conduit to transfer said first coolant flow into and out of said probe head for thermally connecting said first stage to said preamplifier;

a second cooling circuit having a second coolant flow communicating with said receiver coil to cool said receiver coil to a receiver coil temperature and having a second cryogenically insulated transfer conduit to transfer said second coolant flow into and out of said probe head for thermally connecting said second stage to said receiver coil, whereby said preamplifier temperature is higher than said receiver coil temperature.

2. The device of claim 1, wherein said second coolant flow has a temperature below 20° K. directly after leaving the NMR receiver coil and said first coolant flow has a temperature of about 80° K. after leaving the preamplifier.

3. The device of claim 1, wherein said first and said second cooling circuits are connected in parallel.

4. The device of claim 3, wherein said second circuit comprises a third heat exchanger thermally connected to said first cooling stage and said first heat exchanger is thermally connected to said first cooling stage.

5. The device of claim 4, wherein said first circuit comprises a fourth counter-flow heat exchanger upstream of said first heat exchanger and downstream of said first transfer conduit.

6. The device of claim 3, wherein said first circuit comprises a first room temperature value to control said first coolant flow and said second circuit comprises a second room temperature value to control said second coolant flow.

7. The device of claim 1, wherein said first and said second cooling circuits are connected in series.

8. The device of claim 7, wherein said first circuit comprises a cooled valve for controlling said first coolant flow to the preamplifier.

9. The device of claim 7, wherein said second circuit comprises a third heat exchanger thermally connected to said first cooling stage and said first heat exchanger is thermally connected to said first cooling stage.

10. The device of claim 7, wherein said first heat exchanger warms said second coolant flow downstream of said second transfer conduit to create said first coolant flow.

11. The device of claim 10, wherein said warmed second coolant flow is branched-off upstream of said first transfer conduit.

12. The device of claim 1, further comprising a heater for heating the preamplifier.

13. The device of claim 1, further comprising a common cryogenic insulation disposed about said first and said second transfer conduits.

* * * * *